(12) United States Patent
Suh et al.

(10) Patent No.: US 7,453,202 B2
(45) Date of Patent: *Nov. 18, 2008

(54) ORGANIC EL DISPLAY DEVICE HAVING ORGANIC SOLUBLE DERIVATIVE LAYER

(75) Inventors: Min-Chul Suh, Suwon-si (KR);
Mu-Hyun Kim, Suwon-si (KR);
Jang-Hyuk Kwon, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 686 days.

This patent is subject to a terminal disclaimer.

(21) Appl. No.: 11/011,597

(22) Filed: Dec. 15, 2004

(65) Prior Publication Data

US 2005/0153166 A1 Jul. 14, 2005

Related U.S. Application Data

(63) Continuation-in-part of application No. 10/167,651, filed on Jun. 13, 2002, now Pat. No. 6,853,147.

(30) Foreign Application Priority Data

Nov. 28, 2001 (KR) ............................. 2001-74703

(51) Int. Cl.
*H05B 33/12* (2006.01)

(52) U.S. Cl. ................. 313/506; 313/504; 313/505

(58) Field of Classification Search ............... 313/506, 313/495–512; 315/169.3, 169.4; 257/40, 257/79; 428/690; 345/30, 36, 44, 45; 445/24, 445/25
See application file for complete search history.

(56) References Cited

U.S. PATENT DOCUMENTS 5,103,269 A    4/1992   Tomomura et al. ............ 257/78
5,247,190 A    9/1993   Friend et al. .................. 257/40
5,343,050 A    8/1994   Egusa et al. .................. 257/40
5,965,281 A   10/1999   Cao ........................... 428/690
5,998,085 A * 12/1999   Isberg et al. ................ 430/200
6,001,413 A   12/1999   Matsuura et al. ............. 427/64
6,117,965 A    9/2000   Hwang et al. ................ 528/35

(Continued)

FOREIGN PATENT DOCUMENTS

JP    11-149981    6/1999

(Continued)

OTHER PUBLICATIONS

Office Action issued in Korean Patent Application No. 2001-74703 on Jul. 31, 2004.

*Primary Examiner*—Joseph L. Williams
*Assistant Examiner*—Elmito Breval
(74) *Attorney, Agent, or Firm*—Stein, McEwen & Bui, LLP

(57) ABSTRACT

An organic EL display device includes first and second electrodes, a light-emitting layer interposed between the first and second electrodes, an organic soluble derivative layer arranged between the first electrode and the light-emitting layer, wherein the organic soluble derivative layer prevents impurities from being diffused to the light-emitting layer, and a small molecular hole transporting layer between the organic soluble derivative layer and the light-emitting layer.

24 Claims, 3 Drawing Sheets

U.S. PATENT DOCUMENTS

| | | | |
|---|---|---|---|
| 6,291,126 B2 | 9/2001 | Wolk et al. | 430/200 |
| 6,384,528 B1 | 5/2002 | Friend et al. | 313/504 |
| 6,391,482 B1 | 5/2002 | Matsuo et al. | 428/690 |
| 6,399,222 B2 | 6/2002 | Arai et al. | 428/690 |
| 6,402,579 B1 | 6/2002 | Pichler et al. | 445/24 |
| 6,404,126 B1 | 6/2002 | Arai et al. | 313/503 |
| 6,406,802 B1 | 6/2002 | Arai et al. | 428/690 |
| 6,488,555 B2 | 12/2002 | Pichler et al. | 445/24 |
| 6,586,876 B2 | 7/2003 | Tsai et al. | 313/509 |
| 6,597,109 B1 | 7/2003 | Arai et al. | 313/506 |
| 6,605,823 B1 | 8/2003 | Pichler et al. | 257/40 |
| 2002/0037427 A1* | 3/2002 | Taguchi | 428/690 |
| 2002/0070663 A1* | 6/2002 | Ogura et al. | 313/506 |
| 2002/0096995 A1* | 7/2002 | Mishima et al. | 313/506 |
| 2002/0109458 A1 | 8/2002 | Pichler et al. | 313/504 |
| 2002/0190256 A1 | 12/2002 | Murakami et al. | 257/72 |
| 2004/0214034 A1* | 10/2004 | Utsugi et al. | 428/690 |

FOREIGN PATENT DOCUMENTS

| | | |
|---|---|---|
| JP | 11-236446 | 8/1999 |
| KR | 2002-15279 | 2/2002 |

* cited by examiner

ORGANIC EL DISPLAY DEVICE HAVING ORGANIC SOLUBLE DERIVATIVE LAYER

CROSS-REFERENCE TO RELATED APPLICATIONS

This application is a continuation-in-part application of U.S. application Ser. No. 10/167,651, filed Jun. 13, 2002, now, U.S. Pat. No. 6,853,147, which claims the benefit of Korean Patent Application No. 2001-74703 filed on Nov. 28, 2001, both of which are hereby incorporated by reference for all purposes as if fully set forth herein.

BACKGROUND OF THE INVENTION

1. Field of the Invention

The present invention relates to an organic electroluminescent (EL) display device, and more particularly, to an organic EL display device having an organic soluble derivative layer.

2. Description of the Related Art

An organic EL display device includes an anode, a hole injection layer, a hole transporting layer, a light-emitting layer, an electron transporting layer, an electron injection layer, and a cathode which are sequentially stacked on a substrate. In the case of an organic EL display device comprising a low-molecular material, the above-described layers are formed using a vacuum deposition technique. In the case of an organic EL display device comprising a polymer, the above-described layers are formed using a spin-coating technique, which places limitations on forming the light-emitting layer thereof.

FIG. 1 shows a cross-sectional view of a conventional organic EL display device comprising a high-molecular material, such as a polymer. The organic EL display device includes an anode 10, a hole injection layer 12, a light-emitting layer 14, and a cathode 16 which are stacked in sequence as shown.

The hole injection layer 12 is formed using a spin coating technique, and has a structure such that the hole injection layer 12 is not dissolved in an organic solvent during a spin coating operation to form the light-emitting layer 14. As a result, an interface characteristic between the hole injection layer 12 and the light-emitting layer 14 deteriorates. In addition, water or inorganic and organic impurities affect the light-emitting layer 14, thereby lowering stability and shortening a life span of a resulting device.

U.S. Pat. No. 5,247,190 discloses an organic EL display device including an anode electrode and a cathode electrode with a light-emitting polymer interposed therebetween. The organic EL display device of U.S. Pat. No. 5,247,190 has a disadvantage in that a light-emitting efficiency is low and a life span is short because a work function of the two electrodes is not approximate or identical to a highest occupied molecular orbital (HOMO) value and a lowest unoccupied molecular orbital (LUMO) value of the light-emitting polymer.

In order to overcome the problem, the cathode electrode is made of a metal having a work function similar to the LUMO value of the light-emitting polymer. However, since the anode electrode has to be made of a transparent conductive material, there are many restrictions to using an anode electrode material.

Accordingly, a water-soluble material such as PEDOT (mixture of a poly(3,4)-ethylenedioxythiophene and a polystyrenesulfonate) or PANI (mixture of a polyaniline and a polystyrenesulfonate), available from Bayer AG and Allied Signal, respectively, is deposited on the anode electrode using a spin coating technique in order to form a hole injection layer. The hole injection layer buffers an interface between the anode electrode and the light-emitting polymer, thereby increasing a light-emitting efficiency, a driving voltage and a life span.

However, the PEDOT and the PANI are ionic materials which dissolve in water and are high in absorptiveness. Thus, even though a firing process is performed after the spin coating operation, it is almost impossible to remove the water remaining on a surface thereof. In particular, since the PEDOT and the PANI show a strong acidity when water exists therein, a reduction is likely to occur on an interface between the hole injection layer and the light-emitting polymer.

In addition, the PEDOT and the PANI provide poor adhesion to the light-emitting polymer. Therefore, where the light-emitting polymer is patterned to form a light-emitting layer, the light-emitting layer having a bad pattern characteristic is formed.

Currently, much research is being conducted to improve an interface characteristic between a hole injection layer and a light-emitting layer by introducing a surfactant or an adhesive.

On the other hand, U.S. Pat. No. 5,998,085 discloses a method of forming R, G and B light-emitting layers of an organic EL display device using a laser induced thermal imaging (LITI) technique. The LITI technique requires at least a light source, a transfer film and a substrate. Light emitted from the light source is absorbed by a light absorbing layer of the transfer film and is converted into a heat energy. An image forming material on the transfer film is transferred to the substrate by the heat energy to thereby form a desired image. The LITI technique is also used to form a color filter of a liquid crystal display (LCD) device and a light-emitting layer.

However, a conventional LITI technique shows a bad transfer characteristic. Therefore, there is a need for a material and a structure which improve a transfer characteristic of a light-emitting polymer of an organic EL display device.

SUMMARY OF THE INVENTION

Accordingly, it is an object of the present invention to provide an organic EL display device having a high light-emitting efficiency and an improved life span.

It is another object of the present invention to provide an organic EL display device having an excellent light-emitting layer pattern.

Additional objects and advantages of the invention will be set forth in part in the description which follows and, in part, will be obvious from the description, or may be learned by practice of the invention.

To achieve the above and other objects of the present invention, there is provided an organic EL display device, comprising: first and second electrodes; a light-emitting layer interposed between the first and second electrodes; an organic soluble derivative layer arranged between the first electrode and the light-emitting layer, wherein the organic soluble derivative layer prevents impurities from being diffused to the light-emitting layer; and a small molecular hole transporting layer between the organic soluble derivative layer and the light-emitting layer.

There is also provided an organic EL display device, comprising: first and second electrodes; a light-emitting layer arranged between the first and second electrodes; at least one organic soluble derivative layer on the first electrode; and a small molecular hole transporting layer between the light-emitting layer and the organic soluble derivative layer, wherein the organic soluble derivative layer increases an adhesion of the light-emitting layer to the organic EL display device and prevents impurities from being diffused to the light-emitting layer.

The organic soluble derivative layer includes a synthetic polymer or a mixture which may also have a hole transporting ability, and has a solubility of more than 10 g/L to an organic solvent.

The synthetic polymer is one polymer selected from a group consisting of an arylamine-based polymer, a perylrene-based polymer, and a pyrrole-based polymer, and the mixture includes at least one optically inert polymer and at least one arylamine-based small-molecular material.

The optically inert polymer is one selected from a group consisting of a polystyrene, a poly(styrene-butadiene)co-polymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorine-polyimide, a transparent fluoric resin, and a transparent acrylic resin; and the arylamine-based low-molecular material is one selected from a group consisting of TPD (N,N'-diphenyl-N,N'-di-m-tolyl-biphenyl-4,4'-diamine), NPB, MTDATA (4,4',4"-tris(3-methylphenylphenylamino)triphenylamine), TDATA (4,4',4"-tris(N,N-diphenylamino)triphenylamine), and TDAPB (1,3,5-Tris[N,N-bis-(4-methoxyphenyl)aminophenyl]benzene) available from, for example, Sigma-Aldrich Corporation.

The mixture includes the arylamine-based small-molecular material of 10 wt % to 80 wt % dispersed in the optically inert polymer.

The organic soluble derivative layer has a thickness of 1 nm to 50 nm.

The light-emitting layer is patterned using a laser induced transfer/thermal imaging (LITI) technique.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
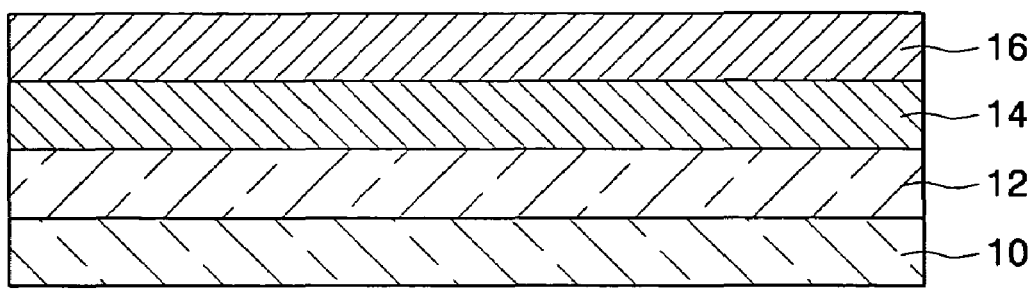
FIG. 1 is a cross-sectional view of a conventional organic EL display device comprising a polymer.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
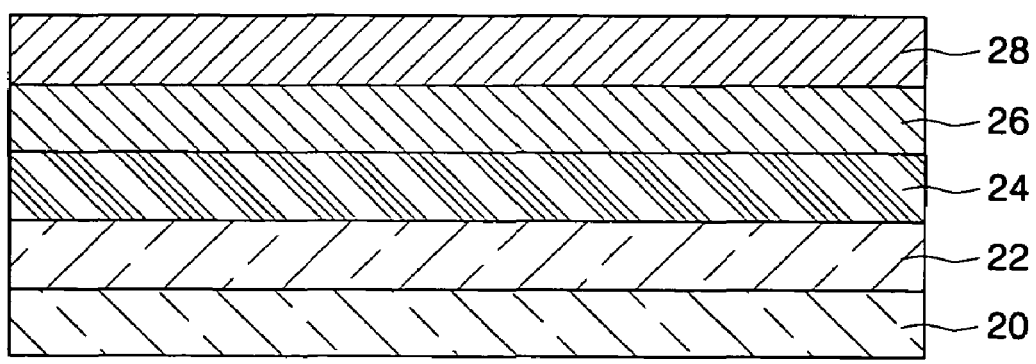
FIG. 2 is a cross-sectional view illustrating an organic EL display device according to an embodiment of the present invention.

FIG. 2 shows a cross-sectional view illustrating an organic EL display device according to an embodiment of the present invention. The organic EL display device includes an anode 20, an organic soluble derivative layer 22, a small molecular hole transporting layer 24, a light-emitting layer 26, and a cathode electrode 28 which are stacked in sequence.

The organic soluble derivative layer 22 prevents impurities from being diffused to the light-emitting layer 26 without lowering a hole transporting ability, thereby improving a performance characteristic of a resulting device. When the small molecular hole transporting layer 24 is formed on the organic soluble derivative layer 22, a life span becomes longer because the small molecular hole transporting layer 24 has an excellent adhesion to the light-emitting layer 26 as well as the organic soluble derivative layer 22.

The organic soluble derivative layer 22 has an excellent adhesion to the light-emitting layer 26. Accordingly, when the light-emitting layer 26 is patterned by a LITI technique, the light-emitting layer 26 has an excellent pattern characteristic.

The organic soluble derivative layer 22 includes a synthetic polymer which may have a hole transporting ability or a mixture which may have a hole transporting ability, and has a relatively high solubility to an organic solvent, such as a benzene or a toluene. The organic soluble derivative layer has a solubility of, for example, more than 10 g/L. The synthetic polymer includes a PVK available from Sigma-Aldrich corporation, a BFE available from Dow chemical company, an arylamine-based polymer, a perylrene-based polymer, and a pyrrole-based polymer.

The mixture comprises an arylamine-based low-molecular material and an optically inert polymer.

The arylamine-based low-molecular material includes TPD, NPB, MTDATA, TDATA, and TDAPB available from, for example, Sigma-Aldrich Corporation.

The optically inert polymer includes a polystyrene, a poly(styrene-butadione) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

The mixture may include the arylamine-based low-molecular material of 10 wt % to 80 wt % dispersed in the optically inert polymer.

As a clarification, it is understood that the organic soluble derivative layer 22 is not to be confused with a conventional hole transporting layer which may be formed between the hole injection layer and the light-emitting layers 12 and 14 of FIG. 1. That is, the organic soluble derivative layer 22 may be used in addition to a hole transporting layer in an organic EL display. It may be formulated and used as a layer which increases adhesion of and prevents impurities from being diffused into the light-emitting layer 24, thereby improving a light-emitting efficiency and life span of the organic EL display, and in addition, serves to transport holes in the organic EL display.

And then, the small molecular hole transporting layer 24 is formed on the organic soluble derivative layer 22.

The small molecular hole transporting layer 24 is a arylamine series or a starburst series. Preferably, the small molecular hole transporting layer 24 is one selected from a group consisting of α-NPB, α-NPD, TPD, CBP, BMA-nT, TBA, o-TTA, p-TTA, m-TTA, spiro-TPD, TPTE, CuPc, TDATA, m-MTDATA, TCTA, 1-TNATA, 2-TNATA, TDAPB, m-MTDAPB, TDAB, and p-DPA-TDAB. The small molecular hole transporting layer 24 can be formed by vacuum deposition method.

Figure 3:
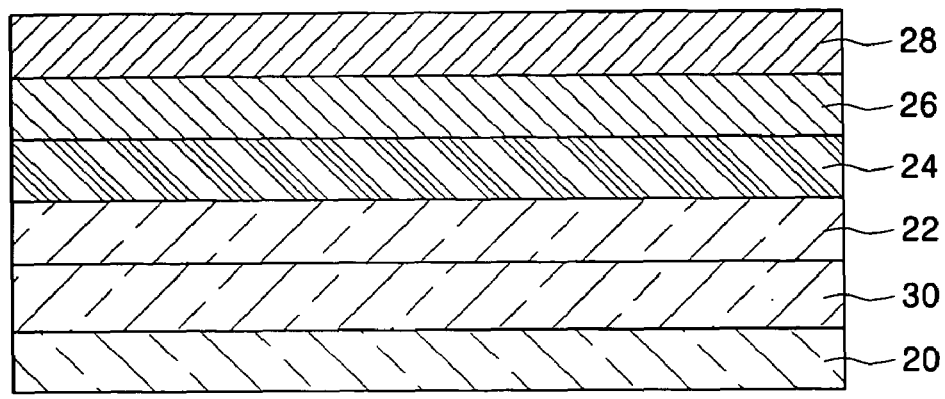
FIG. 3 is a cross-sectional view illustrating an organic EL display according to another embodiment of the present invention.

FIG. 3 shows a cross-sectional view illustrating an organic EL display device according to another embodiment of the present invention.

Referring to FIG. 3, another embodiment of the present invention further comprises a water soluble hole injection layer 30 between the organic soluble derivative layer 24 and the first electrode (anode) 20, in the embodiment of FIG. 2.

The water soluble hole injection layer 30 is a poly sulfide or poly aniline, preferably, PEDOT or PANI.

The water soluble hole injection material is deposited by spin-coating method and then the residual solvent is removed by heat-treating at 30 to 300° C., thereby forming the water soluble hole injection layer 30.

Figure 4:
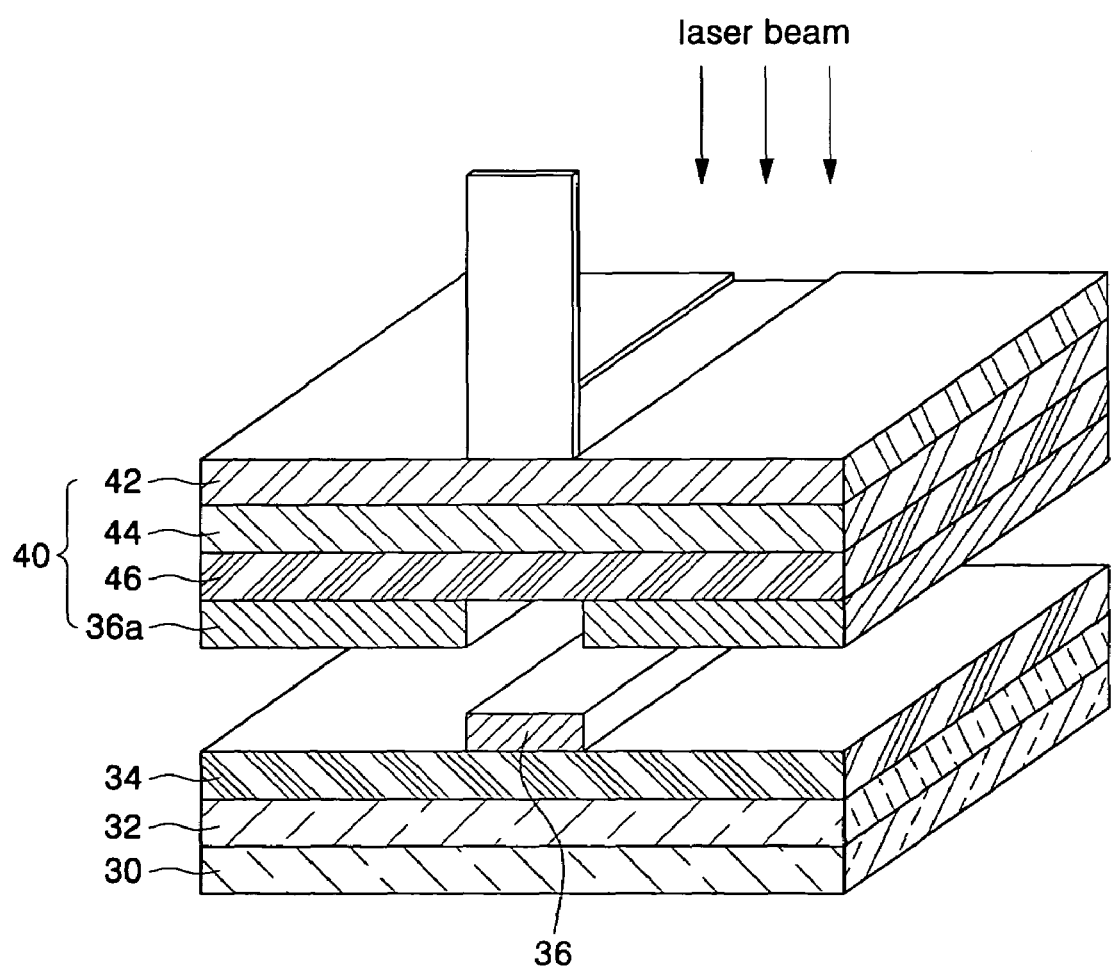
FIG. 4 is a partial perspective view illustrating a method of patterning a light-emitting layer using a LITI technique according to the present invention.

FIG. 4 shows a partial perspective view illustrating a method of patterning a light-emitting layer 36 using a LITI technique. A method of manufacturing an organic EL display device, with reference to FIG. 4, according to the present invention is described below.

A substrate 30 having an anode is cleaned in, for example, an acetone and an isopropylalcohol in sequence and is UV/ozone-treated. An organic soluble derivative is dissolved in an appropriate solvent in an appropriate concentration and stirred for, for example, at least one hour, and then filtered. The organic soluble derivative is deposited on the substrate 30 using, for example, a spin-coating technique to a thickness of 1 nm to 50 nm to thereby form an organic soluble derivative layer 32.

And then, a small molecular hole transporting layer 34 is deposited on the organic soluble derivative layer 32. The small molecular is formed using vacuum deposition method.

Meanwhile, a hole injection layer (not shown) made of PEDOT or PANI is further formed on the substrate 30 using, for example, a spin coating technique and then heat-treated at a temperature of 200° C. for five minutes.

In an organic EL display device, a light-emitting polymer may be dissolved in a solvent which does not dissolve the organic soluble derivative layer 32 and deposited using, for example, a spin coating technique to a thickness of tens of nanometer (nm) to form a light-emitting layer.

In the case of a full color organic EL display device, a transfer film 40 may be used and aligned with the substrate 30 having the organic soluble derivative layer 32 and the small molecular hole transporting layer 34. The transfer film 40 includes a light to heat converting layer 44, and an interlayer insulating layer 46, and a light-emitting polymer layer 36a which are sequentially stacked on a transfer substrate 42. The light-emitting polymer layer 36a is transferred from the transfer film 40 onto the organic soluble derivative layer 32 using the LITI technique to thereby form the light-emitting layer 36. Thereafter, a cathode electrode (not shown) is formed on the light-emitting layer 36. Finally, an encapsulating operation is performed to complete the organic EL display device.

A method of manufacturing an organic EL display device having an organic soluble derivative layer and the small molecular hole transporting layer of the present invention is described in detail below.

For example, a substrate having an anode is cleaned and then UV/ozone-treated for 15 minutes. An organic soluble derivative of 0.5 wt % available under the trade name "BFE" from Dow Chemical Company is dissolved in a toluene solvent and stirred for at least one hour, and spin-coated on the substrate to a thickness of 10 nm to 50 nm at 3,000 rpm.

And then, a small molecular hole transporting layer of α-NPB is formed on the organic soluble derivative layer to a thickness of 300 Å using a vacuum deposition.

A light-emitting polymer of 1.0 wt % to 1.5 wt % available under the trade name "RED" or "BLUE" from Covion Organic Semiconductors GmbH is dissolved in a toluene solvent and sufficiently stirred, and thereafter a polystyrene having a molecular weight of 2,500 available from Sigma-Aldrich Corporation is mixed as a polymer additive to thereby prepare a mixed solution. A mixing mass ratio of the light-emitting polymer and the additive is RED:polystyrene=1:1, and BLUE:polystyrene=1:1.5. The mixed solution is sufficiently stirred at a temperature of 60° C. for at least three hours and is spin-coated on a transfer film to a thickness of 80 nm to thereby form a light-emitting polymer layer.

The light-emitting polymer layer of the transfer film is transferred onto the substrate using a LITI technique to thereby form a light-emitting layer.

Thereafter, a cathode electrode is formed on the light-emitting layer at a high vacuum atmosphere of less than $10^{-7}$ Torr. The cathode electrode includes a Ca layer of 50 m and an Ag layer of 200 nm to 300 nm or a LiF layer of 0.4 nm to 4.0 nm and an Al layer of 100 nm to 600 nm. Finally, an encapsulating operation using a metal can is performed to complete the organic EL display device.

Figure 5:
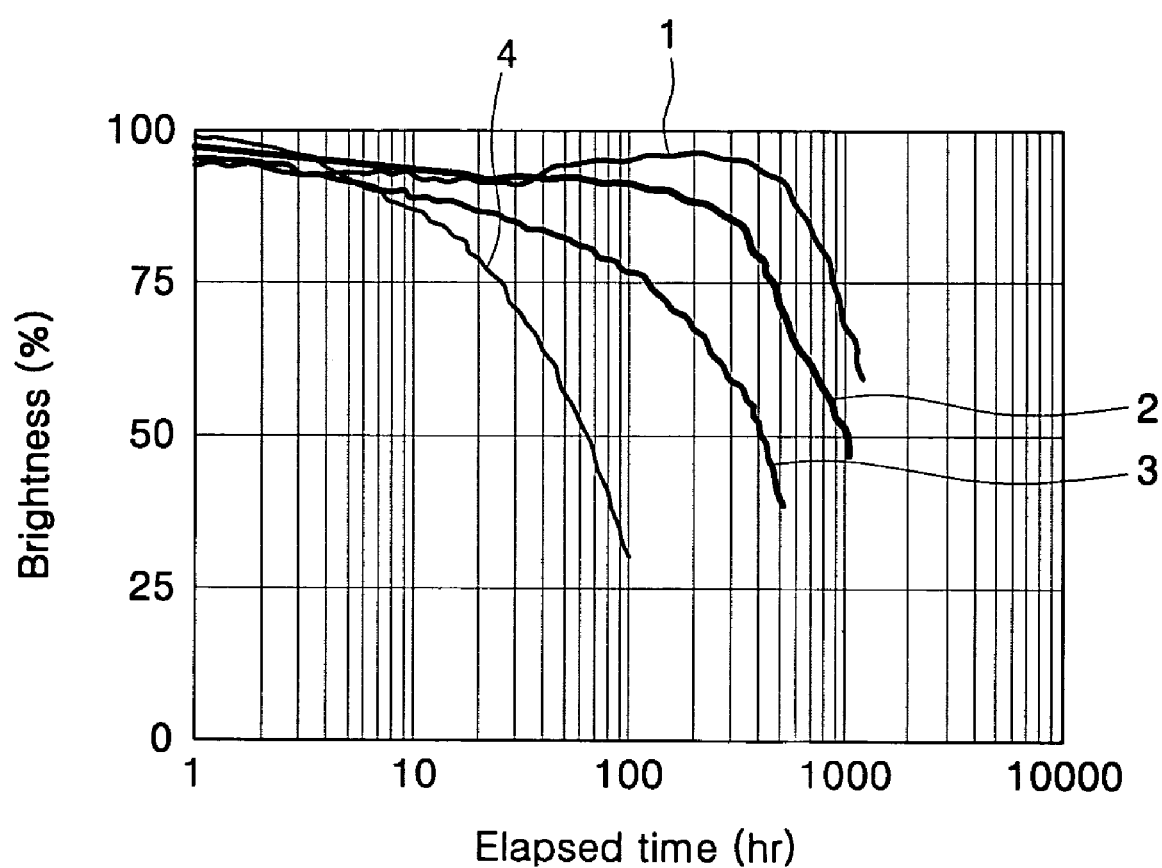
FIG. 5 is a graph of showing a performance of an organic EL display according to embodiments of the present invention and the conventional organic EL display device.

FIG. 5 is a graph of showing a performance of an organic EL display according to embodiments of the present invention and the conventional organic EL display device.

In the case of a red light-emitting layer, an edge roughness of the light-emitting layer patterned by the LITI process is less than 5 μm, leading to an excellent pattern characteristic. When the red light-emitting layer is used and the cathode electrode includes LiF/Al, a light-emitting efficiency is 1.25 Cd/A, a color coordinate is x=0.67 and y=0.32 (CIE 1931, 300 Cd/m² at 6.5 volts), an expected life span is 2,000 hours at 100 Cd/m² and an elapsed time is more than 1,000 hrs (1 of FIG. 5).

On the other hands, when the red light-emitting layer is formed directly on the hole injection layer without employing the organic soluble derivative layer and the small molecular hole transporting layer, a life span is 300 hours at 100 Cd/m².

Also, when the red light-emitting layer is formed on the high molecular hole transporting layer without employing the organic soluble derivative layer and the small molecular hole transporting layer, an elapsed time is about 400 to 500 hrs (3 of FIG. 5).

In the case of a blue light-emitting layer, an edge roughness of the light-emitting layer patterned by the LITI is less than 10 μm, leading to an excellent pattern characteristic. When the blue light-emitting layer is used and the cathode electrode includes Ca/Ag, a light-emitting efficiency is 1.5 Cd/A, a color coordinate is x=0.15 and y=0.1 (CIE 1931, 200 Cd/m² at 6.5 volts), and an expected life span is 1,000 hours at 100 Cd/m². On the other hand, when the blue light-emitting layer is formed directly on the hole injection layer without employing the is organic soluble derivative layer and the small molecular hole transporting layer, a life span is 60 hours at 100 Cd/m² and an elapsed time is about 1,000 hrs (2 of FIG. 5).

On the other hand, when the red light-emitting layer is formed directly on the hole injection layer without employing the organic soluble derivative layer and the small molecular hole transporting layer, an elapsed time is about 70 hrs (4 of FIG. 5).

For another example, a substrate having an anode is cleaned and then UV/ozone-treated for 15 minutes. A water soluble hole injection layer made of a "PEDOT/PSS," available from Bayer AG, is spin-coated on the substrate to a thickness of 20 nm to 50 nm at 3,000 rpm. An organic soluble derivative of 0.5 wt % available under the trade name "BFE" from Dow Chemical Company is dissolved in a toluene solvent and stirred for at least one hour, and spin-coated on the hole injection layer to a thickness of 10 nm to 50 nm at 3,000 rpm.

And then, a small molecular hole transporting layer of α-NPB is formed on the organic soluble derivative layer to a thickness of 300 Å using a vacuum deposition.

A light-emitting polymer of 1.0 wt % to 1.5 wt % available under the trade name "RED" or "BLUE" from Covion Organic Semiconductors GmbH is dissolved in a toluene solvent and sufficiently stirred, and thereafter a polystyrene having a molecular weight of 2,500 available from Sigma-Aldrich Corporation is mixed as a polymer additive to thereby prepare a mixed solution. A mixing mass ratio of the light-emitting polymer and the additive is RED:polystyrene=1:1, and BLUE:polystyrene=1:1.5. The mixed solution is sufficiently stirred at a temperature of 60° C. for at least three hours and is spin-coated on a transfer film to a thickness of 80 nm to thereby form a light-emitting polymer layer.

The light-emitting polymer layer of the transfer film is transferred onto the substrate using a LITI technique to thereby form a light-emitting layer.

Thereafter, a cathode electrode is formed on the light-emitting layer at a high vacuum atmosphere of less than $10^{-7}$ Torr. The cathode electrode includes a Ca layer of 50 nm and an Ag layer of 200 nm to 300 nm or a LiF layer of 0.4 nm to 4.0 nm and an Al layer of 100 nm to 600 nm. Finally, an encapsulating operation using a metal can is performed to complete the organic EL display device.

In the case of a red light-emitting layer, an edge roughness of the light-emitting layer patterned by the LITI process is less than 5 μm, leading to an excellent pattern characteristic. When the red light-emitting layer is used and the cathode electrode includes LiF/Al, a light-emitting efficiency is 1.25 Cd/A, an elapsed time is about 1,000 hrs. On the other hands, when the red light-emitting layer is formed directly on the hole injection layer without employing the organic soluble derivative layer and the small molecular hole transporting layer, a life span is 300 hours at 100 Cd/m² and an elapsed time is about 300 hrs.

As described above, the organic EL display device having the organic soluble derivative layer according to the present invention has a high light-emitting efficiency and an improved life span as compared to a conventional organic EL display device without the organic soluble derivative layer. In addition, the organic EL display device of the present invention has an excellent light-emitting layer pattern.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic EL display device, comprising:
   first and second electrodes;
   a light-emitting layer interposed between the first and second electrodes;
   an organic soluble derivative layer arranged between the first electrode and the light-emitting layer, wherein the organic soluble derivative layer prevents impurities from being diffused to the light-emitting layer; and
   a small molecular hole transporting layer between the organic soluble derivative layer and the light-emitting layer.

2. The device of claim 1, further comprising a water soluble hole injection layer between the organic soluble derivative layer and first electrode.

3. The device of claim 1, wherein the small molecular hole transporting layer is an arylamine series or a starburst series.

4. The device of claim 3, wherein the small molecular hole transporting layer is formed of one selected from the group consisting of α-NPB, α-NPD, TPD, CBP, BMA-nT, TBA, o-TTA, p-TTA, m-TTA, spiro-TPD, TPTE, CuPc, TDATA, m-MTDATA, TCTA, 1-TNATA, 2-TNATA, TDAPB, m-MTDAPB, TDAB, and p-DPA-TDAB.

5. The device of claim 2, wherein the water soluble hole injection layer is formed of PEDOT or PANI.

6. The device of claim 1, wherein the organic soluble derivative layer includes a synthetic polymer or a mixture having a hole transporting ability, and has a solubility of more than 10 g/L to an organic solvent.

7. The device of claim 6, wherein:
   the synthetic polymer is one polymer selected from a group consisting of an arylamine-based polymer, a perylrene-based polymer, and a pyrrole-based polymer, and
   the mixture comprises at least one optically inert polymer and at least one arylamine-based small-molecular material.

8. The device of claim 7, wherein the optically inert polymer is one selected from a group consisting of a polystyrene, a poly(styrene-butadiene)copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

9. The device of claim 7, wherein the arylamine-based small-molecular material is one selected from a group consisting of TPD, NPB, MTDATA, TDATA, and TDAPB.

10. The device of claim 7, wherein the mixture is the arylamine-based small-molecular material of 10 wt % to 80 wt % dispersed in the optically inert polymer.

11. The device of claim 1, wherein the organic soluble derivative layer has a thickness of 1 nm to 50 nm.

12. The device of claim 1, wherein the light-emitting layer is patterned using a laser transfer induced imaging (LITI) technique.

13. The device of claim 1, wherein the organic soluble derivative layer prevents impurities from being diffused to the light-emitting layer without lowering a hole transporting ability.

14. An organic EL display device, comprising:
   first and second electrodes;
   a light-emitting layer arranged between the first and second electrodes;
   at least one organic soluble derivative layer on the first electrode; and
   a small molecular hole transporting layer between the light-emitting layer and the organic soluble derivative layer, wherein the organic soluble derivative layer increases an adhesion of the light-emitting layer to the organic EL display device and prevents impurities from being diffused to the light-emitting layer.

15. The device of claim 14, further comprising a water soluble hole injection layer between the organic soluble derivative layer and first electrode.

16. The device of claim 14, wherein the small molecular hole transporting layer is an arylamine series or a starburst series.

17. The device of claim 16, wherein the small molecular hole transporting layer is formed of one selected from the group consisting of α-NPB, α-NPD, TPD, CBP, BMA-nT, TBA, o-TTA, p-TTA, m-TTA, spiro-TPD, TPTE, CuPc, TDATA, m-MTDATA, TCTA, 1-TNATA, 2-TNATA, TDAPB, m-MTDAPB, TDAB, and p-DPA-TDAB.

18. The device of claim 15, wherein the water soluble hole injection layer is formed of PEDOT or PANI.

19. The device of claim 14, wherein the organic soluble derivative layer includes a synthetic polymer or a mixture having a hole transporting ability, and has a solubility of more than 10 g/L to an organic solvent.

20. The device of claim 19, wherein:
the synthetic polymer is one polymer selected from a group consisting of an arylamine-based polymer, a perylrene-based polymer, and pyrrole-based polymer, and
the mixture comprises at least one optically inert polymer and at least one arylamine-based low-molecular material.

21. The device of claim 20, wherein:
the optically inert polymer is one selected from a group consisting of a polystyrene, a poly(styrene-butadiene) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin, and
the arylamine-based low-molecular material is one selected from a group consisting of TPD, NPB, MTDATA, TDATA, and TDAPB.

22. The device of claim 21, wherein the mixture is the arylamine-based low-molecular material of 10 wt % to 80 wt % dispersed in the optically inert polymer.

23. The device of claim 21, wherein the organic soluble derivative layer has a thickness of 1 nm to 50 nm.

24. The device of claim 23, wherein the light-emitting layer is patterned using a laser transfer induced imaging (LITI) technique.

* * * * *